United States Patent [19]

Keller et al.

[11] 4,223,353
[45] Sep. 16, 1980

[54] VARIABLE PERSISTANCE VIDEO DISPLAY

[75] Inventors: John T. Keller, Willoughby; Robert H. Wake, Solon, both of Ohio

[73] Assignee: Ohio Nuclear Inc., Solon, Ohio

[21] Appl. No.: 958,131

[22] Filed: Nov. 6, 1978

[51] Int. Cl.² .............................................. H04N 5/66
[52] U.S. Cl. ................................... 358/230; 358/168; 340/793; 340/799; 250/363 S
[58] Field of Search .............. 315/30; 250/308, 363 S; 364/521; 358/160, 168, 230, 242; 340/793, 799, 723, 798

[56] References Cited

U.S. PATENT DOCUMENTS 3,798,366  3/1974  Hunt et al. ....................... 340/723 X Primary Examiner—Robert L. Richardson
Attorney, Agent, or Firm—Fay & Sharpe

[57] ABSTRACT

The invention relates to a video display device which includes a memory for storing intensity values for each pixel of the video display. Connected with the memory is a persister which decreases the intensity values as a selectable function of time such that a displayed image will appear to fade. Also connected with the memory is an input for increasing specific intensity values in response to the receipt of input data corresponding to that specific display pixel. The invention further relates to a scintillation camera in combination with the video display device in which input data indicates the occurrence of a radiation caused scintillation at some corresponding coordinate position and in which the rate of image fading is consonant with the rate of data acquisition, whereby a real-time display of the passage of a radioisotope through a patient may be produced.

29 Claims, 1 Drawing Figure

VARIABLE PERSISTANCE VIDEO DISPLAY

BACKGROUND OF THE INVENTION

This application pertains to the art of video display devices and more particularly to video display devices used to display readout images from medical diagnostic equipment. The invention is particularly applicable for displaying the pictures derived from data obtained by scintillation cameras also commonly referred to as radioisotope, gamma, nuclear or Anger-type cameras. Although the invention will be described with particular reference to scintilltion cameras, it will be appreciated that the invention has much broader application.

A persistence scope is a cathode ray tube on which excited regions of phosphor persist or remain luminescent for an extended period of time before fading into darkness. Heretofore, the persistence of luminescing regions on the screen of cathode ray tubes has been achieved through the use of a phosphor which continues to luminesce after the electron beam excitation has been removed. Normally, the rate of fading is determined by the phosphor and is adjusted by controlling the amount of excitation energy in the electron beam.

One of the prior art problems has been the lack of ability of control differences in displayed brightness or intensity. It is an inherent limitation of persistence cathode ray tubes that only three or four discernible shades of grey are displayable. The lack of distinctive levels of shading make output data relatively difficult to read and interpret. In scintillation cameras, for example, differences in intensity are important indicia to the medical technician of variation in radioisotope concentration. It is desirable to be able to determine these concentrations accurately.

Another problem with the prior art persistence screens is size and cost. Persistence screens are costly to manufacture even in small sizes and cost increases rapidly with size. Commonly, only relatively small persistence screen sizes are available rendering interpretations of the display relatively inaccurate.

Further, persistence cathode ray tubes are electronically complex. This complexity results in unreliability and difficulty of adjustment. It is not uncommon for prior art persistence scopes to fail at a rate approaching thirty percent per year.

SUMMARY OF THE INVENTION

The present invention contemplates a new and improved persistence type display which overcomes all of the above referred problems and provides a display which is large, easy to read, reliable and economical.

In accordance with the present invention, there is provided a persistence scope in which the retention and fading of the displayed images are controlled electronically.

In accordance with a more limited aspect of the invention, there is provided an electronic storage matrix, a video monitor for displaying the contents of the storage matrix, and supportive electronic circuitry for adding and removing data from the contents of the storage matrix. Input data such as from a scintillation camera is stored in the storage matrix for display on a video monitor. The electronic circuitry at a variable rate deletes information from the storage matrix. As information is deleted and no longer displayed on the video monitor, the video image fades with the appearance of a persistence phosphor.

In accordance with a more limited aspect of the invention, electronic circuitry removes or fades the data at various rates consistent with the rate of input data acquisition such as linearly, exponentially or in various other selectable modes.

In accordance with yet another aspect of the invention, the input data to the storage matrix may be weighted such as logarithmically to increase the dynamic range of the persistence scope.

One major advantage of the invention is the improved output display. Not only can a larger display be obtained but one with greater definition. The video display monitor can display numerous shades of grey. Rather than the three or four shades of grey available on a conventional CRT persistence scope, the present invention can produce sixteen or more discernible shades of grey.

Another advantage of the present invention is the use of digital electronics. This simplifies and reduces the number of adjustments, increases the reliability and simplifies the interfacing with other digital electronic equipment such as video tape recorders, enhancement processing apparatus, etc.

BRIEF DESCRIPTION OF THE DRAWINGS

The invention may take physical form in certain parts and arrangements of parts, a preferred embodiment of which will be described in detail in the specification and illustrated in the accompanying drawings which form a part thereof.

THE FIGURE is an overall system view of a persistence scope in accordance with the present invention in combination with a scintillation camera.

DESCRIPTION OF THE PREFERRED EMBODIMENT

Figure 1:
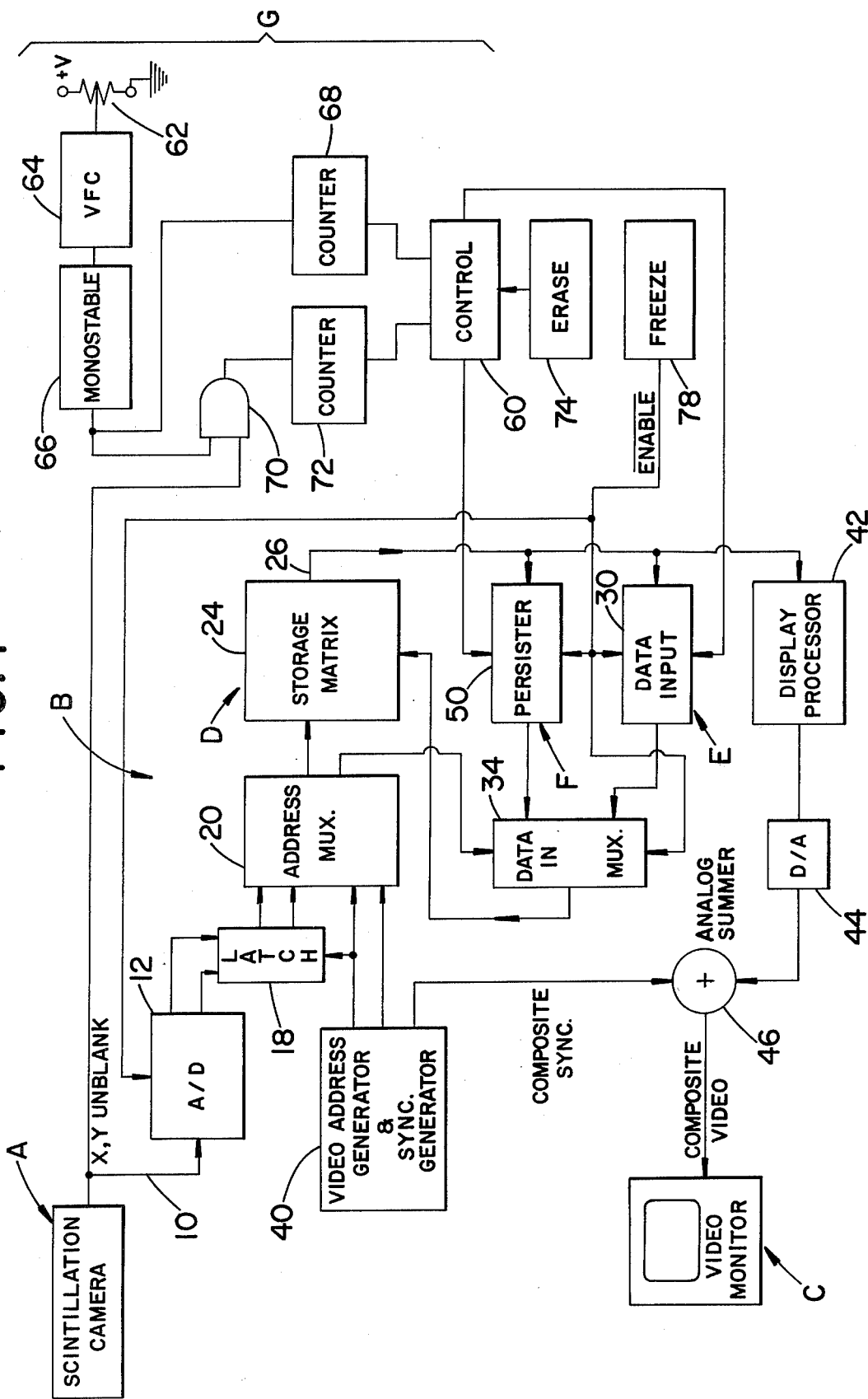

Referring now to the drawings wherein the showings are for the purposes illustrating a preferred embodiment of the invention only and not for purposes of limiting it. The figure shows a scintillation camera A in conjunction with an electronic video persistence scope including electronic persistence and control circuitry B and a video monitor C.

Scintillation cameras are conventional nuclear medicinal diagnostic devices. A scintillation camera such as the one shown in U.S. Pat. No. 3,011,057 to Anger or in U.S. Pat. No. 3,911,278 to Stout are exemplary of scintillation cameras which may be used.

In using a scintillation camera, a medical technician commonly injects a fluid containing one or more radioisotopes into the patient's blood. After a time, the technician monitors the distribution of each radioisotope in the patient for such purposes as monitoring blood flow or the propensity of organs or tissue to absorb isotope containing components of the fluid.

The scintillation camera is positioned adjacent the patient in such a position that radioactive emissions from the isotope impinge upon it. The scintillation camera includes a flat scintillation plate, any position on which can be described by an x,y coordinate. Each time a radiation emission impinges on the scintillation plate it fluoresces with a characteristic intensity. Electronic circuitry in the camera senses the fluorescence and as described in the Stout and Anger patents, supra, produces analog signals inditing the x and y coordinates of the scintillation. A third signal, commonly called a z signal indicates the intensity of the scintillation. By comparing the z signal with one or more known references, the camera can determine if each pair of x,y coordinate signals represents a plurality of simultaneous flashes, or stray radiation, or for some other reason is undesirable. This comparison produces an unblanking signal from the camera to enable only desirable x,y coordinate signals to be displayed. The unblanking signal can also be used to indicate which of plural isotopes the scintillation represents.

In the past, each analog pair of x,y coordinate signals was conveyed to an oscilloscope-type cathode ray tube, with a persistence phosphor. If an appropriate unblanking signal was also produced, the electron beam of the cathode ray tube would excite a small region or dot of the phosphor at a location corresponding to the x,y coordinate represented. This small dot of phosphor fluoresces for a period of time gradually decreasing in intensity until it goes black.

In the present invention, a TV-type video monitor is used with a phosphor which quickly stops fluorescing, sometimes called a short afterglow. To retain the benefits of persistence phosphor effect, the present invention includes circuitry which causes the luminescence of the video monitor to appear to fade. This fading is achieved by exciting a region of the phosphor corresponding to a x,y coordinate a plurality of times, each successive time with less energy.

Looking now to THE FIGURE, the preferred embodiment will first be described with a broad overview. As discussed above, a scintillation camera A produces x coordinate, y coordinate and unblanking signals. A persistence circuit B receives these signals and causes the signals to produce a persistence scope display on a video monitor C.

Persistence circuit B includes a storage means D and new data input means E. Each time a valid coordinate signal is received by persistence circuit B, the new data input means E records in storage means D that an additional coordinate signal was received for that location. Thus, the storage means retains a record of how many scintillations are received corresponding to each x,y coordinate.

The video monitor C cyclicly monitors the record retained in the storage means. As the electron beam of the video monitor scans past the location on its face corresponding to each x,y coordinate, it causes the phosphor to fluoresce with an intensity corresponding to the number of coordinate signals recorded in storage means D at an address corresponding to the displayed x,y coordinate.

A persister F is by definition a means for removing information relating to the receipt of coordinate signals from storage means D. In effect, the persister causes the storage means to "forget" that some coordinate signals were received.

Thus in operation, the new data input means E with the receipt of the each coordinate signal builds up the stored record in storage means D of the number of coordinate signals received corresponding to each x,y coordinate. The persister to the contrary decreases the stored record of the number of coordinate signals received corresponding to all coordinate positions.

A control means G controls the rate at which the persister F removes information from the storage means. The rate can be selected to be proportional to the rate at which unblanking signals are generated by the camera—, i.e. the rate of radiation impinging on the camera from the injected isotope. Or the operator may select the rate as a function of time alone.

Looking to the details of persistence circuit B, the output of the scintillation camera is conveyed electronically such as by line 10 to its input. Connected with the input is an analog-to-digital converter 12 for converting the analog x and y coordinate signals into digital representations. This conversion is enabled by the presence of an appropriate unblanking signal. The number of bits in the digital representations is, of course, a function of the degree of accuracy with which the x and y coordinates are to be identified. It has been found that a seven bit binary analog-to-digital converter is satisfactory with scintillation cameras. The digital x and y coordinate representations may be held temporarily in a latch 18.

The digital x and y coordinate representations from the analog-to-digital converter forms the input of an address selection means 20. This address selection means, such as address multiplexer, derives from the digital x and y coordinate representation a corresponding address in the storage means D.

The storage means in the preferred embodiment is a storage matrix 24 with a plurality of addresses. There is an address corresponding to each digital x,y coordinate representation generated by the analog-to-digital converter. For a seven bit analog-to-digital converter, i.e. $2^7$ possible x values and $2^7$ possible y values, $2^{14}$ address should be available. Further, the storage matrix must be able to count the number of coordinate signals received corresponding to each address. Seven bits of storage per address has been found satisfactory. Accordingly, a $128 \times 128 \times 7$ storage matrix may be used to provide the above storage.

Each time the address selecting means 20 addresses one of the addresses of the storage matrix 24, the value stored at the selected address is fed out of the storage means on line 26. This output line is connected to the new data input means E which includes modifying means 30 for modifying the value. Modifying means 30, in the preferred embodiment, is a means for increasing the stored value through addition, multiplications, etc. As will be explained below, several methods of modifying this value may be used. In a first embodiment, modifying means 30 is a digital adder. Each time the receipt of new data causes the storage matrix to be addressed, the value stored at that address is conveyed by line 26 to modifying means 30 where a constant is added to it. A convenient constant has been found to be the integer 4. The new increased value with the constant added is transferred to a data input multiplexer 34. Upon receiving a control signal, such as from address selection means 20, that the storage matrix was addressed for purposes of adding new incoming data, multiplexer 34 returns the new increased value to the storage matrix and substitutes it for the value at that address.

To generate the video display, a video address and synchronization generator 40 cyclicly causes the values stored at each address in storage matrix 24 to be marshalled onto line 26. A display processor 42 translates each value on line 26 into a corresponding shade of grey for the video monitor. For example, by working with the four most significant bits of each value, sixteen shades of grey may be designated, however, more or fewer shades may be generated. The video processor may also perform such functions as averaging values corresponding to adjacent x or y coordinates to generate interpolated data for the video monitor.

The digital representation from the display processor of the shade of grey which corresponds to the addressed value is converted to an analog signal by digital-to-analog converter 44.

Video address and synchronization generator 40 also coordinates the scanning of the electron beam of the video monitor with the addressing of the storage matrix. As the grey tone for each value emerges from converter 44, the generator 40 causes the electron beam of the video monitor to be aimed at a position corresponding to the x,y coordinate corresponding to the address from which the value producing the grey tone was obtained. The synchronization of the scanning is in the form of a composite sync signal which is added with the grey scale analog value by an analog summer 46. This sum forms a composite video signal for controlling video monitor C.

One way of coordinating the acquisition of new data with the display of old data, is for the generator 40 to allow a short time interval between video line scans. During this interval, new data which was temporarily held during the line scanning in latch 18 or a sample and hold circuit is added to the values in the storage matrix.

As data values are marshalled onto line 26 for video display, each value is also received by persister F. Persister F may take various forms for altering the magnitude of each value according to various functions. The persister includes means 50 for altering the values. In the preferred embodiment, altering means 50 reduces the values, such as by subtraction, multiplying by a fraction, dividing, etc.

The reduced value from the output of the altering means 50 is conveyed to data input multiplexer 34. Multiplexer 34 returns the diminished value from the persister to the corresponding address, if signaled by address selection means 20 that the storage matrix was addressed for circulating values to the video monitor. If the storage matrix were addressed for new data input multiplexer 34 would, of course, return the values from modifying means 30 to the storage matrix.

In the first embodiment of the new data input E in which it adds the constant 4 to the value for each new input signal, persister F subtracts the constant 1 from each value as it is circulated to the video monitor. This enables even a stored value indicative of only a single event, to be attenuated over several passes of the data through the video monitor.

As alluded above, there are several alternate implementations for handling the data. For example, the persister F may be implemented with a multiplication means, such as a digital multiplier which multiplies each value by a fraction less than 1, e.g. 0.9. In this implementation, the values are each lowered by a preselected percentage in each pass of the data. This achieves negative exponential attenuation of the stored values. An advantage of an exponential attenuation is that addresses at which the stored values are increasing rapidly have their values attenuated rapidly. Addresses at which the stored values are increasing slowly have their values attenuated more slowly. Thus, regions with a high rate of data acquisition attenuate more rapidly than regions with a low rate of data acquisition.

As another alternative, the persister may be implemented with a read-only memory (ROM). Each value on line 26, acts to address the ROM, in response to which the ROM conveys to multiplexer 34 a value corresponding to that ROM address. The ROM implementation can be used to achieve a linear attenuation, exponential attenuation, or other nonlinear or partially linear attenuations determined by the programming of the ROM.

The new data input means E may alternately be implemented with a multiplication means, such as a digital multiplier, which multiplies each value by a preselected constant greater than 1. As yet another alternative, new data input means may be implemented with a read-only memory (ROM). Each stored value acts as an address to the ROM causing a larger value to be generated by the ROM for return to that address of memory matrix 24. The ROM can be programmed to cause the memory matrix to store the logarithm of the number of scintillations at each x,y coordinate. To achieve such a logarithmic conversion, the ROM is preprogrammed to implement a transfer function of the type generally designated by the formula $$1-e^{-x}.$$

This logarithmic conversion allows the video persistence scope to display images varying over a large dynamic range. For example, the same display has been found capable of representing regions receiving 2000 scintillations per minute and other regions receiving 2,000,000 scintillations per minute, i.e. a 1000:1 dynamic range. For a logarithmic display in which each grey shade represents a change in the rate of data acquisition by a factor of 2, ten shades of grey produce a display with a dynamic range of 1024:1.

The display processor 42 may also transfer stored nonlogarithmic values to logarithmic representation to improve the dynamic range of the display. Further, the display processor may cause the video monitor to display either positive or negative image by displaying the data or (1−data).

A major advantage of the present video persistence scope over a CRT with a persistence phosphor is the operator's flexibility in controlling the rate of fading. To control the fade rate, a persistence or fading control means G is provided. The control means can control the persistence in numerous manual and automatic ways. These ways include altering the amount by which the magnitude of the values is reduced in each pass. Alternately, the percent of passes in which the magnitude is reduced may be altered, that is, persister could be caused to reduce the magnitude of only some of the cyclic passes through the storage matrix for producing the video display. Fade rates in which the intensity is attenuated by 50% in one quarter to ten seconds are preferred.

In the preferred embodiment, the frequency with which persistence operation occurs controls the rate of fading. The operator may select either a manual or automatic mode. In the manual mode, a variable voltage supply 62 is varied by the operator to select the fading rate. The selected voltage is converted to a frequency proportional to the selected voltage by a voltage to frequency converter 64. The output from the voltage to frequency converter 64 triggers a monostable circuit 66 which provides a series of output pulses in tune with the selected frequency. The pulses from the monostable circuit 66 are channelled in the manual mode to a counter 68. Each time counter 68 reaches preselected number it resets itself and signals a persistence control circuit 60. Thus, circuit components 62, 64, 66 and 68 form a timing means for periodically generating a control signal whose rate is controlled by component 62.

Upon receipt of the control signal, persistence control circuit 60 causes the next full cyclic pass of values from storage matrix 24 to the video monitor to be decreased by persister F. By adjusting the voltage, hence, the frequency, the speed or rate with which the counter 68 reaches a preselected level may be varied. This, in turn, varies the percent of passes in which the persister is enabled.

In the automatic mode, the rate of persistence or fading is automatically adjusted as a function of the rate of data accumulation. To achieve this, the unblanking signals from the scintillation camera and the series of pulses from the monostable circuit 66 are fed to an AND gate 70. The output of AND gate 70 is indicative of the coincidence of monostable pulses and unblanking signals. The higher the data acquisition rate, the more coincident events occur.

The output of AND gate 70 is connected to a counter means 72 for counting radiation impingements on the camera. Each time counter 72 reaches predetermined count, it generates a control signal which causes control means 60 to enable the persister to decrease the next full cyclic pass of values from the storage matrix to the video monitor. In this manner, the rate at which stored values are decreased by the persister is consistent with and proportional to the rate at which radiation is received by the scintillation camera A.

The control means G include a variety of operator actuated controls, such as means for selecting manual or automatic fading, the subtractive, multiplicative or ROM persistence implementation, a persistence constant, the mode of new data input, a new data input constant and other operator controls.

One of the other controls is an erase control 74. The erase control causes the control means to zero the values at all addresses of the storage matrix. This may be done by setting the magnitude of all the elements of the storage matrix to 0 directly or by causing the persister to decrease each value by 100% such as by using a multiplicative persistence constant of 0.

Another control function is a freeze mode initiated by a freeze means 78. The freeze means causes the present stored values to be rendered inviolate, so that the present display will remain unchanged. One implementation of the freeze mode is to block the analog-to-digital converter 12 from digitizing new data and blocking persister F from reducing present values. Alternately, data input multiplexer 34 may be blocked from transferring new values from the persister F or new data input E to the storage matrix. Or the persister and new data input means can have their modes and constants adjusted so that the incremental increase for each new coordinate signal is zero and the persistence decrease is zero.

Examples of circuit chips which may be used for new data input means E and the persister F include adders designated 74LS83, multipliers designated 74LS284/285, PROM's designated Intel 3624, or numerous other solid state circuit chips.

It will be appreciated that with alternate logic implementations the persister may increase the magnitude of the stored values. Likewise, the new data input may decrease the magnitudes of the stored values.

The invention has been described with reference to the preferred embodiment. Clearly numerous modifications and alterations will occur to others upon reading and understanding of this specification. It is our intent to include all such modifications and alterations insofar as they come within the scope of the pending claims or the equivalence thereof.

We claim:
1. A video display apparatus comprising:
   a circuit for causing a persistence scope-like display on a video monitor including a storage means having a plurality of addresses able to store values of a plurality of magnitudes for each address and means operatively connected with said storge means for progressively altering over a plurality of video frames the value stored at each storage address as a function of time; and
   a video monitor operatively connected to said storage means for displaying in successive video frames the magnitudes of the values currently stored at each storage address.

2. The video display apparatus as set forth in claim 1 in which said altering means includes means for subtracting a constant from each stored value thereby generating the related value.

3. The video display apparatus as set forth in claim 1 in which said altering means includes means for multiplying each stored value by a fraction less than 1 thereby generating the related value.

4. The video display apparatus as set forth in claim 1 further including control means operably connected with said altering means for varying the rate of altering the stored values.

5. The video display apparatus as set forth in claim 4 further including synchronization generator means for cyclicly addressing each address and coordinating the sweeps of the video monitor with the cyclic addressing wherein each cyclic addressing of substantially all addresses once is a cyclic pass through the storage means and wherein said control means includes means for blocking said persister means on a variably selectable percent of cyclic passes.

6. The video display apparatus as set forth in claim 1 further including new data input means operably connected with said storage means for modifying the stored value at each address as a function of new data received.

7. The video display apparatus as set forth in claim 6 wherein said new data input means includes means for adding a constant to the stored value at each address.

8. The video display as set forth in claim 6 wherein said new data input means includes read-only-memory means wherein the value for an address in the storage means addresses the read-only-memory means to select a table value for return to the same address in the storage means.

9. A video control apparatus for causing a persistence scope-like display on a video monitor comprising:
   a storage means having a plurality of addresses, said storage means able to store values of a plurality of magnitudes corresponding to each address;
   address means for addressing said addresses to cause stored values to be removed from said storage means, said removed values adapted to be displayed on a video monitor;
   synchronization means operatively connected with said address means for synchronizing the addressing of said addresses by the address means with video sweep control signals, whereby the video sweep control signals and the addressing means are synchronized such that the removed value for each address is adapted to be displayed at a preselected location on a controlled video display;

means for altering the removed values, said removing means operatively connected with said storage means;

means for returning altered values to the storage means to become stored values, said returning means operatively connected with the altering means and the storage means.

10. The apparatus as set forth in claim 9 wherein said stored values are digital amounts representing the number of scintillations occurring at coordinate positions corresponding to each of said plurality of addresses, and wherein said altering means alters said removed values such that the altered values represent a lesser number of scintillations.

11. The apparatus as set forth in claim 9 wherein said synchronization means causes said address means to address said addresses cyclicly in a predetermined order, and further including control means for blocking said altering means during a fraction of the cycles whereby the control means controls the rate at which values are altered.

12. The apparatus as set forth in claim 9 wherein said address means is adapted to receive signals indicative of new data, said address means responding to new data signals to address addresses corresponding to the new data, and further including modifying means operatively connected with said storage means for modifying stored values at addresses corresponding to new data.

13. The apparatus as set forth in claim 12 wherein said modifying means includes means for increasing stored values logarithmically whereby the storage means stores logarithmically compressed values.

14. The apparatus as set forth in claim 12 further including a scintillation camera adapted to produce analog signals indicative of the coordinate positions at which incident radiation is received, an analog-to-digital converter operatively connected with said scintillation camera for converting said analog signals to digital signal, said analog-to-digital converter operatively connected with said address means to supply the signals indicative of new data thereto.

15. A scintillation camera apparatus comprising:
a scintillation camera adapted to receive impinging incident radiation at a plurality of coordinate positions, said scintillation camera determining a coordinate position corresponding to at least some impingements of incident radiation; and
a circuit for causing a persistence scope-like display on a video monitor including a storage means for storing values indicative of the number of determined impingements of incident radiation at each of said plurality of coordinate positions, said storage means operatively connected with said scintillation camera to receive coordinate positions of determined impinging incident radiation; and means for altering the stored values to indicate a smaller number of impingements of incident radiation at least at some coordinate positions, said altering means operatively connected with said storage means, and control means for controlling said altering means to cause said altering means to alter the stored values at a rate consistent with an average rate of incident radiation impingement on said scintillation camera, said control means operatively connected with said scintillation camera, whereby the rate at which the number of impingements of incident radiation indicated by the stored values is decreased is approximately equal to the rate at which determined impingement of incident radiation are received by the scintillation camera.

16. The apparatus as set forth in claim 15 wherein said control means comprises a counter means for counting at least part of the number of determined impingements of incident radiation, control circuit means for enabling the altering means to alter the stored values when said counter means reaches a predetermined count, said control circuit means operatively connected with said counter means and said altering means.

17. The apparatus as set forth in claim 16 further including means for adjusting the part of the number of impingements counted by said counter.

18. The apparatus as set forth in claim 15 wherein said altering means comprises means for subtracting from each stored value an amount indicative of a preselected number of impingements of incident radiation.

19. The apparatus as set forth in claim 15 wherein said altering means comprises means for multiplying each value by a fraction less than one whereby the stored number of impingements decreases exponentially.

20. The apparatus as set forth in claim 15 further including a video monitor operatively connected with said storage means for displaying an image derived from the current stored values.

21. A scintillation camera apparatus having a video display comprising:
a scintillation camera for determining a coordinate position of at least some incident radiation;
address selection means operatively connected with said scintillation camera means for selecting an address corresponding to each coordinate position;
a storage means operatively connected with said address selecting means for storing values representing the receipt of radiation by the scintillation camera at various coordinate positions at an address corresponding to each coordinate position;
a video monitor operatively connected with said storage means for displaying the stored values to form a representation of the radiation incident upon the scintillation camera;
data input means operatively connected with said storage means for modifying the stored values responsive to the receipt of radiation by the scintillation camera at an address corresponding to the coordinate position of the received radiation; and
means operatively connected with said storage means for altering the stored values at each address as a function of time.

22. The apparatus as set forth in claim 21 wherein said data input means increases the magnitude of the values at each selected address and said altering means decreases the magnitude of the values at each address.

23. The apparatus as set forth in claim 22 wherein said input data means includes a means for adding a first constant to the value stored at each selected address and wherein said altering means includes subtraction means for subtracting a second constant from the value stored at each address.

24. The apparatus as set forth in claim 21 further including synchronization generator means for passing the value at each address in the storage means to the video monitor wherein as the value from each address is passed to the video monitor said altering means alters the value and returns altered value to said memory means.

25. The apparatus as set forth in claim 24 further including control means for selectively disabling said altering means from altering the values.

26. The apparatus as set forth in claim 25 wherein said control means is operatively connected with said scintillation camera for monitoring the rate of radiation receipt by the scintillation camera and wherein said control means disables the said altering means for a period of time varying with the rate of radiation receipt.

27. The method of examining a patient with a radioisotope injected into its blood with a scintillation camera positioned over the region of the patient to be examined comprising the steps of:
  (a) producing a coordinate signal representing the coordinate position of radiation received by the scintillation camera;
  (b) transforming the coordinate signal into a memory address and addressing a memory;
  (c) passing a value stored at the memory address out of the memory;
  (d) modifying the passed value and returning the modified value to the memory address;
  (e) serially addressing a plurality of memory addresses and passing the value stored at each memory address out of the memory;
  (f) altering each serially addressed value and returning the altered value to the corresponding address in the memory; and
  (g) serially displaying the values on a video monitor to produce a visual display representing radiation receipt at various coordinate positions of the scintillation camera.

28. The method as set forth in claim 27 wherein the modifying step includes increasing the passed value and the altering step includes decreasing the passed value whereby the magnitudes of a stored value is increased by each receipt of radiation by the scintillation camera and decreased with the passing of data from the memory to the video monitor.

29. The method as set forth in claim 27 further including the step of periodically ceasing altering the serially addressed values.

* * * * *